(12) United States Patent  
Cho et al.

(10) Patent No.: US 6,552,950 B2
(45) Date of Patent: Apr. 22, 2003

(54) NONVOLATILE SEMICONDUCTOR MEMORY DEVICE HAVING CHANGEABLE SPARE MEMORY ADDRESS

(75) Inventors: Tae-Hee Cho, Suwon (KR); Yeong-Taek Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 50 days.

(21) Appl. No.: 09/996,240

(22) Filed: Nov. 28, 2001

(65) Prior Publication Data

US 2002/0186588 A1 Dec. 12, 2002

(30) Foreign Application Priority Data

Jun. 11, 2001 (KR) ........................................ 2001-32468

(51) Int. Cl.[7] ................................................ G11C 8/00
(52) U.S. Cl. .................. 365/230.01; 365/210; 365/200; 365/238.5
(58) Field of Search ........................... 365/185.17, 200, 365/210, 221, 230.01, 230.06, 235, 238.5, 230.09, 154, 191, 236

(56) References Cited

U.S. PATENT DOCUMENTS

| | | | |
|---|---|---|---|
| 4,460,998 A | * | 7/1984 | Yamada et al. ............. 365/200 |
| 4,849,938 A | * | 7/1989 | Furutani et al. ............ 365/200 |
| 5,406,565 A | * | 4/1995 | MacDonald ................ 714/711 |
| 5,523,975 A | * | 6/1996 | Reddy ........................ 365/200 |
| 5,572,466 A | * | 11/1996 | Sukegawa .............. 365/185.11 |
| 6,034,539 A | | 3/2000 | Hwang |
| 6,236,602 B1 | * | 5/2001 | Patti .......................... 365/200 |

* cited by examiner

*Primary Examiner*—David Nelms
*Assistant Examiner*—Thong Le
(74) *Attorney, Agent, or Firm*—F. Chau & Associates, LLP

(57) ABSTRACT

A nonvolatile semiconductor memory device comprising a main memory cell array and a spare memory cell array, capable of freely accessing data in the spare memory cell array irrespective of the physical addresses of the spare memory cell array, and a method thereof are disclosed. The logical addresses of the spare memory cell array are assigned prior to the logical addresses of the main memory cell array in response to a first control signal, and data stored in the spare memory cell array is read earlier than data in the main memory cell array.

20 Claims, 9 Drawing Sheets

NONVOLATILE SEMICONDUCTOR MEMORY DEVICE HAVING CHANGEABLE SPARE MEMORY ADDRESS

BACKGROUND

1. Technical Field

The present invention relates to a nonvolatile semiconductor memory device, and more particularly, to a nonvolatile semiconductor device capable of freely accessing memory cell arrays irrespective of physical addresses of the memory cell arrays and a method thereof.

2. Description of Related Art

It is well known that nonvolatile semiconductor memory devices can permanently store data in memory cells when an external power goes off, and that such devices are typically used in applications for mask read only memory (MROM), programmable read only memory (PROM), erasable and programmable read only memory (EPROM) and electrically erasable and programmable read only memory (EEPROM).

With MROMs, PROMs or EPROMs, users cannot easily erase or reprogram stored data because the erasing or reprogramming of the stored data is performed on the board of the memory device. However, with EEPROMs, users can readily perform an erase or reprogramming operation, because the EEPROM can be electrically erased and reprogrammed repeatedly through the application of higher than normal electrical voltage. Therefore, EPROMs are used in numerous applications, such as system program storage devices or auxiliary memory devices requiring frequent data renewal. For instance, EEPROMs having a more compact size and capable of operating at high speed are typically required in various applications such as electronic devices controlled by computers or microprocessors, or in a battery powered computer system such as a portable or laptop computer system.

Flash EEPROMs are largely classified into a NAND type, NOR type or AND type EEPROM depending on how memory cells are connected to bit lines. The NAND type EEPROM can be integrated at higher density than the NOR or AND type, because the number of select transistors per cell and the number of holes contacted with bit lines can be reduced in the NAND type. An example of a NAND type flash EEPROM is disclosed in an article entitled "NEW DEVICE TECHNOLOGIES FOR 5V-ONLY 4 Mb EEPROM WITH NAND STRUCTURE CELL" of IEDN, pp. 412 to 415, 1988. Further, an improved device, in which NAND cell units are formed on a P type well region of an N type semiconductor substrate, and a method for erasing and programming the device are disclosed an article entitled "A NAND STRUCTURED CELL WITH A NEW PROGRAMMING TECHNOLOGY FOR HIGHLY RELIABLE 5V-ONLY FLASH EEPROM" of "symposium on VLSI Technology", pp. 129–130, 1990. Such NAND type Flash EEPROM can be advantageously applied at a large scaled sub-memory device because of its high density.

In the NAND flash EEPROM memory cells, N-type source and drain regions are spaced on a P-type substrate. A floating gate and a control gate, which are separated by an insulating layer, are sequentially formed on a channel region formed between the source and drain regions. Program data are accumulated in the conductive floating gate (FG) in response to a program voltage applied to the control gate (CG).

The NAND type flash EEPROM has erase, write and read operations. The erase and write operations are performed by using F-N tunneling current. During the erase operation, a high voltage Vsub is applied to a substrate and a low voltage is applied to a control gate (CG). At this time, a voltage Vfg, which is determined in response to the ratio of the capacitance between the CG and FG and the capacitance between the FG and the substrate, is applied to the FG. When the potential difference between the floating gate voltage Vfg and the substrate voltage Vsub is larger than the voltage for producing the F-N tunneling, electrons accumulated in the FG flow to the substrate. As a result, a threshold voltage Vt of the memory cell transistor will drop, and the erase operation is performed. In the erase operation, 0V is applied to the CG and the source region and a voltage for producing current flowing through therein is applied to the drain region. The erased cell may be said to be storing a logic "1". In the write operation, 0V is applied to the source and drain regions and a high voltage is applied to the CG. At this time, an inversion layer is formed in the channel region and the source and drain regions have a potential of 0V.

When the potential difference between Vfg and Vchannel (0V) is large enough to produce an F-N tunneling, electrons flow from the channel region to the FG. In this case, the Vt increases and a program operation is performed. In the program operation, a predetermined voltage is applied to the CG, 0V is applied to the source region, and a proper voltage is applied to the drain region, but current does not flow through the drain. The programmed cell may be said to be storing a logic "0".

In the NAND type flash memory, a unit of a memory cell array comprises a first select transistor, a second select transistor, and a cell string having a plurality of memory cell transistors in which drain-source channels are connected in serial with each other and FGs are formed between the first and second transistors. The cell string may be called a NAND cell unit. In addition to the memory cell array, the NAND type flash memory comprises bit lines for inputting/receiving data to/from the cell strings, word lines crossed with the bit lines for controlling gates of the memory cell transistors and the select transistors, a X decoder for selecting the word lines, page buffers connected to the bit lines to sense and store input/output data of the memory cell transistors, and a Y decoder circuit for controlling data input/output to/from the page buffers.

In the memory cell array, a page unit comprises all the memory cell transistors whose control gates commonly connected to one word line. A cell block comprises a plurality of pages, a unit of cell block generally comprises one or a plurality of cell strings per bit line.

As described above, the NAND type flash memory generally performs a read operation and a program operation by a page unit and an erase operation by a cell block unit. Practically, electrons flowing between the FG and the channel of the memory cell transistor only occurs in the erase operation and the program operation.

In a read operation, after the erase operation and the program operation, data stored in the memory cell transistors are read without damaging the stored data. In the read operation, a non-selected CG receives a higher voltage than a selected CG. As a result, a current flowing on a corresponding bit line depends on the programmed state of the selected memory cell transistor. If a threshold voltage of the programmed memory cell is higher than a reference voltage, the memory cell is an "off-cell" and a corresponding bit line is charged with a high voltage. In contrast, if the threshold voltage of the programmed memory cell is lower than a reference voltage, the memory cell is an "on-cell", and the corresponding bit line is discharged with a low voltage. A sense amplifier, called as a page buffer, determines the state of a bit line as "0" or "1".

In this case, since the number of cell strings coupled to one bit line is large, the amount of loading on the bit line is large and the amount of current flowing through the "on-cell" during sensing the "on-cell" is small. Accordingly, the time for developing voltage and the time for sensing the "on-cell" should be relatively long. Thus, the time for reading data is long and a read operation is slow. To solve the problem, the NAND type flash memory performs the read operation by a page unit for serial access operation, in which all data in one page are read at one time and the results are output in serial. As a result, when the amounts of data are large, the reading time per one bit is likely reduced and the sensing time can be reduced.

One page of the memory cell array comprises a page of main memory array and a page of spare memory array. The main memory array stores general information and the spare memory array stores error correction codes and page information.

There are a main sequential read operation mode, a spare sequential read operation mode, and a whole page sequential read operation mode. In the main sequential read operation mode, a read operation is transferred to the main memory array of a next page without a particular command. In the spare sequential read operation mode, a read operation is performed only in the spare memory array, and in the whole page sequential read operation mode, a read operation is successively performed in both the main memory array and the spare memory array. In the whole page sequential read operation mode, an address of the main memory array is determined as a start address of the read operation.

Accordingly, when users access the main memory array after reading the page information of the spare memory array, they cannot access the spare memory array earlier than the main memory array. As a result, when a high-speed random access is required, for example, minor data (such as an error correction code information or page information of stored data) is read in advance, the NAND type flash memory cannot support an optimum operation mode.

SUMMARY OF THE INVENTION

It is an object of the present invention to provide a nonvolatile semiconductor memory device capable of freely accessing a spare memory array before and after accessing a main memory array according to an external command or an option signal.

It is another object of the present invention to provide a nonvolatile semiconductor memory device for optimally performing a whole page sequential read operation mode.

It is further object of the present invention to provide a nonvolatile semiconductor memory device capable of reading data in a spare memory cell array prior to reading data in a main memory cell array.

It is further object of the present invention to provide a method for reading data in a nonvolatile semiconductor memory device capable of first reading data stored in a spare memory cell array irrespective of physical addresses of the spare memory cell array.

According to an aspect of the present invention, a method is provided for reading data in a nonvolatile semiconductor memory device comprising a main memory cell array and a spare memory cell array comprising a plurality NAND cell strings, wherein physical addresses of the main memory cell array are placed prior to physical addresses of the spare memory cell array. The method comprises the steps of assigning logical addresses of the spare memory cell array prior to logical addresses of the main memory cell array in response to a first control signal; and reading data stored in the spare memory cell array earlier than to data in the main memory cell array using the logical addresses.

According to another aspect of the present invention, a nonvolatile semiconductor memory device is provided. The nonvolatile semiconductor memory device comprises a memory cell array comprising a main memory cell array and a spare memory cell array comprising a plurality NAND cell strings, wherein physical addresses of the main memory cell array are placed prior to physical addresses of the spare memory cell array; a column selector for selecting column path of the memory cell array; a column decoder for applying a column decoding signal to the column selector; an address counter for counting external addresses to output a column address counting signal to the column decoder, and counting logical addresses of the spare memory cell array prior to logical addresses of the main memory cell array in response to an external command input at a spare start whole page sequential read mode; a final point moving circuit for receiving a spare start read signal and a spare enable signal to generate a final point signal; a final column address detector for detecting a final column address in response to the final point signal to enter into a next spare start whole page sequential read mode and outputting the detected address as a page end signal; a spare to main controller for generating a spare to main signal in response to the spare start read signal; and a reset controller for resetting the address counter in response to the page end signal and the spare to main signal to count the addresses of the memory cell arrays from zero (0) logical address.

According to further aspect of the present invention, a method is provided for reading data in a nonvolatile semiconductor memory device comprising a spare memory cell array and a main memory cell array. The method comprises the step of performing one of a main data only sequential read mode, a spare data only sequential read mode, and a main start whole page sequential read mode, in response to at least a first control signal that indicates data is to be read in the main memory cell array earlier than in the spare memory cell array; and performing a spare start whole page sequential read mode, in response to at least a second control signal that indicates data is to be read in the spare memory cell array earlier than in the main memory cell array by assigning logical addresses of the spare memory cell array prior to logical addresses of the main memory cell array.

According to further aspect of the present invention, a method is provided for reading data in a nonvolatile semiconductor memory device comprising a spare memory cell array and a main memory cell array comprising a plurality of NAND cell strings. The method comprises the steps of receiving a first control signal that indicates data is to be read in the spare memory cell array earlier than in the main memory cell array;

counting addresses of the spare memory cell array and reading data at the counted addresses of the spare memory cell array; and counting addresses of the main memory cell array and reading data at the counted addresses of the main memory cell array after counting each address of the spare memory cell array.

According to the present invention, the logical addresses of the spare memory cell array can be assigned prior to/after the logical addresses of the main memory cell array.

Advantageously, the present invention can perform a spare start sequential read mode in addition to a conventional sequential read mode.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS

Figure 1:
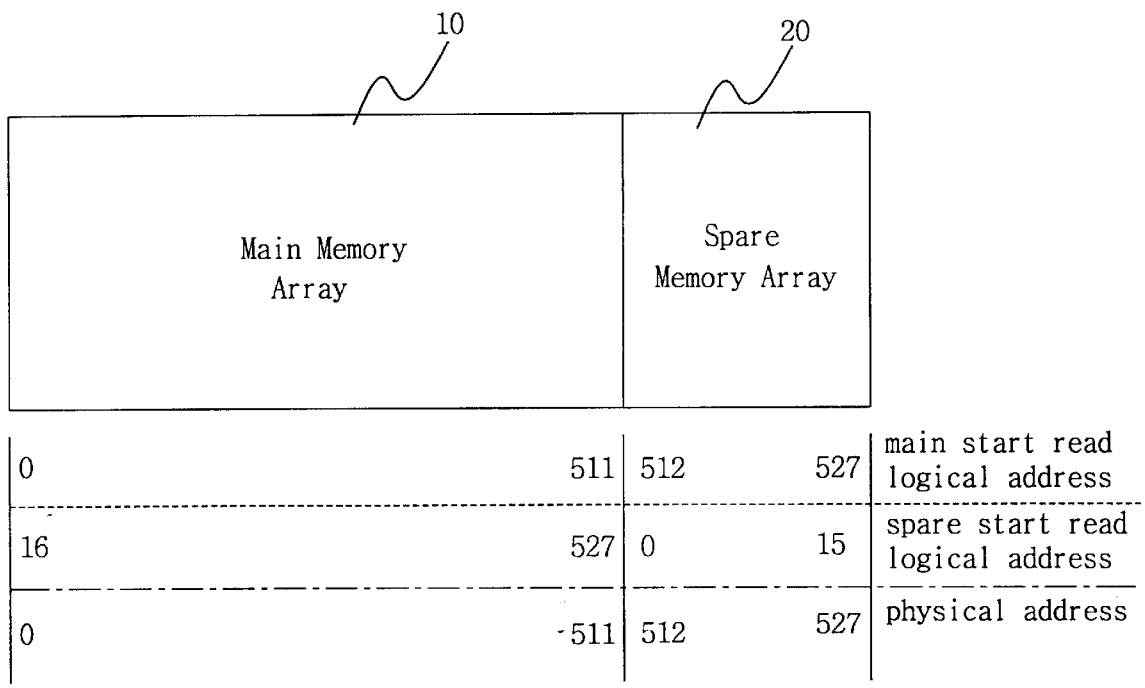
FIG. 1 is a diagram illustrating the relationship between the physical addresses and the logical addresses of a memory cell array according to an embodiment of the present invention.

In the following description, similar reference numerals are used through the accompanying drawings to denote similar or equivalent parts or portions. Also, in the following description, specifications will be made to provide a thorough understanding of the present invention. It is apparent to one skilled in the art, however, that the present invention can be achieved without such specifications. A detailed description of well known functions and structures will be omitted so as to clarify key points of the present invention.

FIG. 1 is a diagram illustrating a relationship between physical addresses and logical addresses of a memory cell array according to an embodiment of the present invention. In a column address of a NAND flash memory, for example, physical addresses "0" to "511" are assigned to a main memory array 10 and physical addresses "512" to "527" are assigned to a spare memory array 20.

In accordance with the present invention, logic addresses of the column address may be changed according to certain commands. For example, if an ordinary command such as 00h 01h 50h is applied to a memory cell array, the logical addresses coincide with the physical addresses of the memory cell array. Certain commands, however, may be applied to a memory cell array such that logical addresses "0" to "15" are assigned to the physical addresses "512" to "527" of the spare memory array 20 and the logical addresses "16" to "527" are assigned to the physical addresses "0" to "511" of the main memory array 10. In one embodiment of the present invention, the spare memory array 20 is first accessed, and then the main memory array 10 accessed.

Figure 2A:
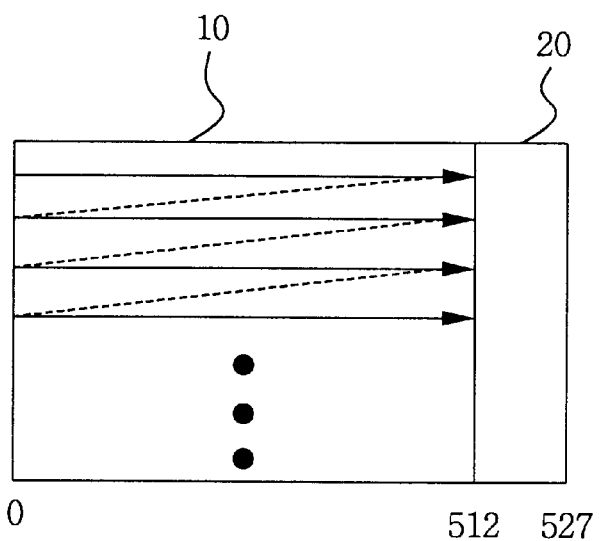
FIGS. 2A to 2C are diagrams illustrating various sequential read operations according to a conventional method.
Figure 2B:
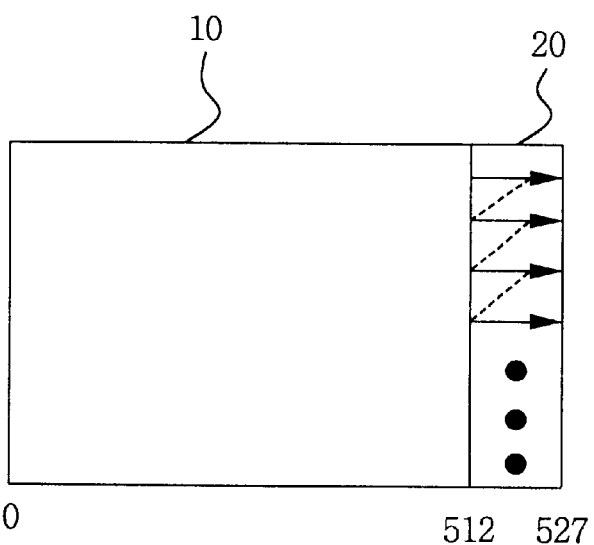
Figure 2C:
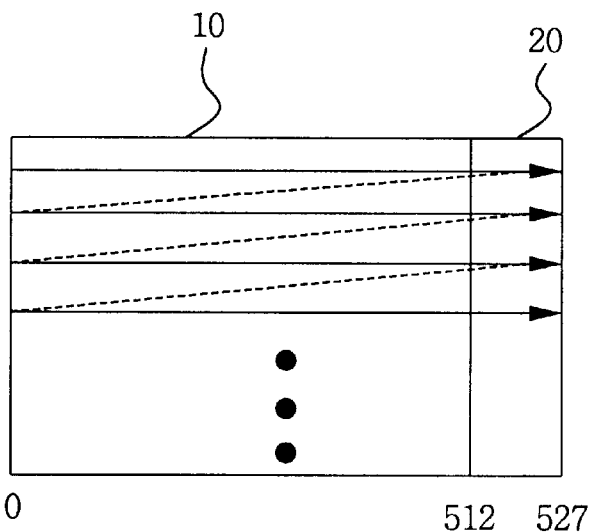
Figure 2D:
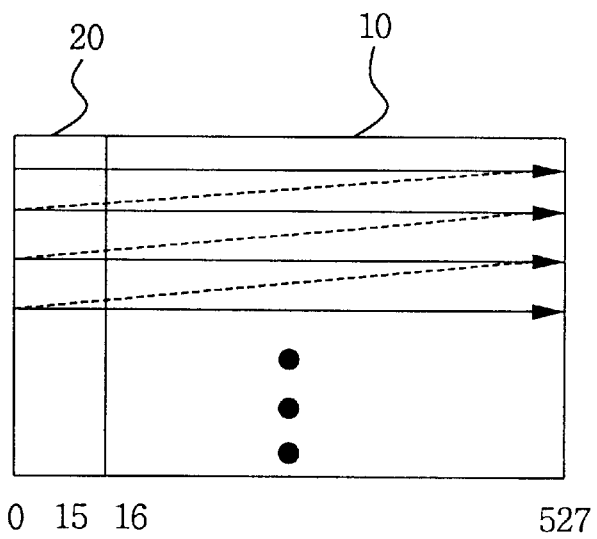
FIG. 2D is a diagram illustrating a read operation according to an embodiment of the present invention.

FIGS. 2A–2C illustrate read operation modes according to conventional methods, and FIG.2D illustrates a read operation mode according to one aspect of the invention. In particular, FIG. 2A illustrates a conventional main data only sequential read operation mode. In this mode, the spare memory array 20 is not accessed and a next page of the main memory array 10 is accessed for a read operation without a particular command.

FIG. 2B illustrates a spare data only sequential read operation mode, in which a data read operation is performed only in the spare memory array 20.

FIG. 2C illustrates a main start whole page sequential read operation mode, in which the main memory array 10 and the spare memory array 20 are sequentially accessed for a read operation. The logical addresses "0" to "527" are sequentially assigned to "0" to "511" of the main memory array 10 and "512" to "527" of the spare memory array 20. With this read operation mode, a user cannot access to the spare memory array 20 earlier than the main memory array 10.

FIG. 2D illustrates a read operation mode according to an embodiment of the present invention, in which logical addresses "0" to "15" are assigned to physical addresses "512" to "527" of the spare memory array 20 and logical addresses "16" to "527" are assigned to physical addresses "0" to "511" of the main memory array 10.

Figure 3A:
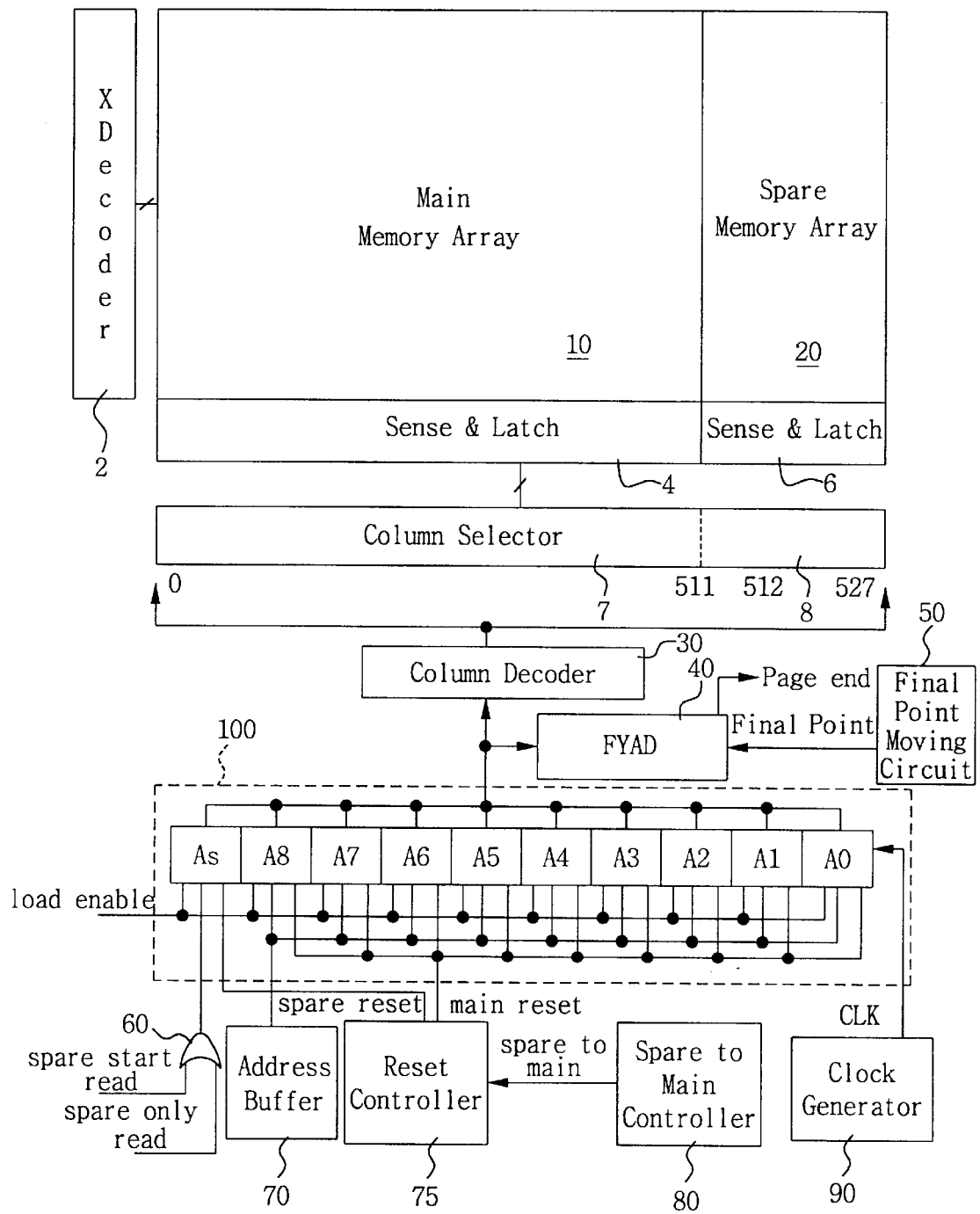
FIG. 3A is a block diagram of a nonvolatile semiconductor memory device for performing a read operation mode according to an embodiment of the present invention.

FIG. 3A is a block diagram of a nonvolatile memory device according to an embodiment of the invention for performing the read operation mode illustrated in FIG. 2D.

Referring to FIG. 3A, the memory device comprises a memory cell array comprising a main memory array 10 and a spare memory array 20 formed of a plurality of NAND cell strings; a X decoder 2 for selecting word lines connected to the NAND cell strings; sense amplifiers and latches 4, 6, which are operatively connected to the memory cell array through bit lines for detecting and storing input/output data of memory cell transistors in the NAND cell string; column selectors 7, 8 connected, respectively, to the sense amplifiers and latches 4, 6, for selecting a predetermined column path; a column decoder 30 connected to the column selectors 7, 8, for performing the column path selecting operation; an address buffer 70 for buffering and storing external addresses; an address counter 100 for receiving addresses output from the address buffer 70 and outputting a column address counting signal to the column decoder 30; a clock generator 90 for generating a clock signal to increase the counting value in the address counter 100 in response to an external clock; a final Y address detector 40 (FYAD) for detecting a final column address and outputting a "page end" signal to perform a next read operation; a reset controller 75 for resetting the address counter 100 to make the counting value as a logical address "0" in response to the "page end" signal; a gate 60 for gating a "spare start read" signal and a "spare only read" signal and inputting the response to the address counter 100; a final point moving circuit 50 for receiving a "spare start read" signal and a "spare enable read" signal to produce a "final point" signal and inputting the "final point" signal to the final Y address detector 40; and a spare to main controller 80 for inputting a "spare to main" signal to the reset controller 75 in response to the "spare start read" signal.

Figure 3B:
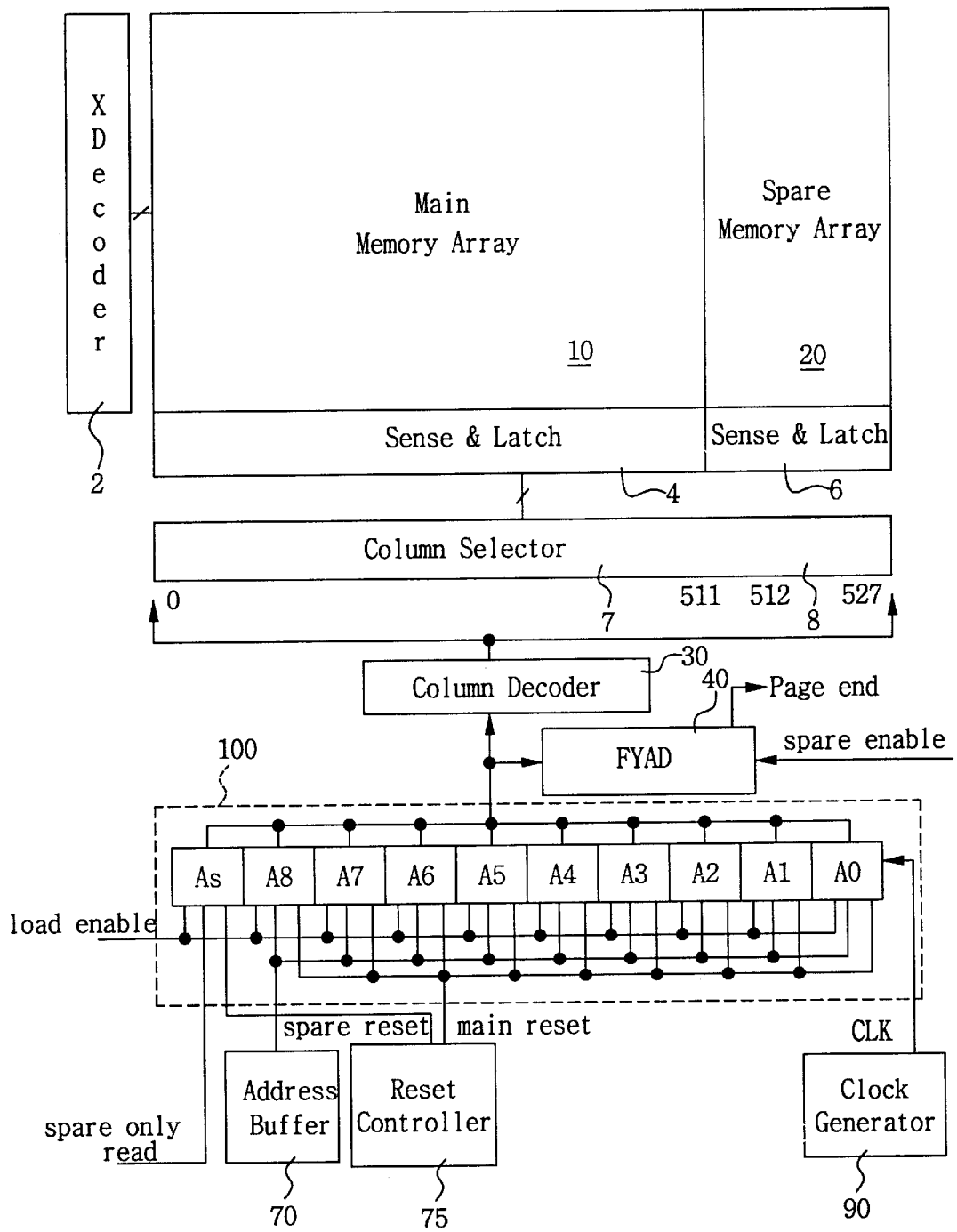
FIG. 3B is a circuit diagram of a nonvolatile semiconductor memory device for performing a read operation mode according to conventional methods.

FIG. 3B shows a conventional nonvolatile memory cell device for performing the main start whole page sequential read operation mode shown in FIG. 2C. The conventional memory cell device comprises similar components as FIG. 3A except for the final point moving circuit 50, the gate 60, and the spare to main controller 80.

Figure 4:
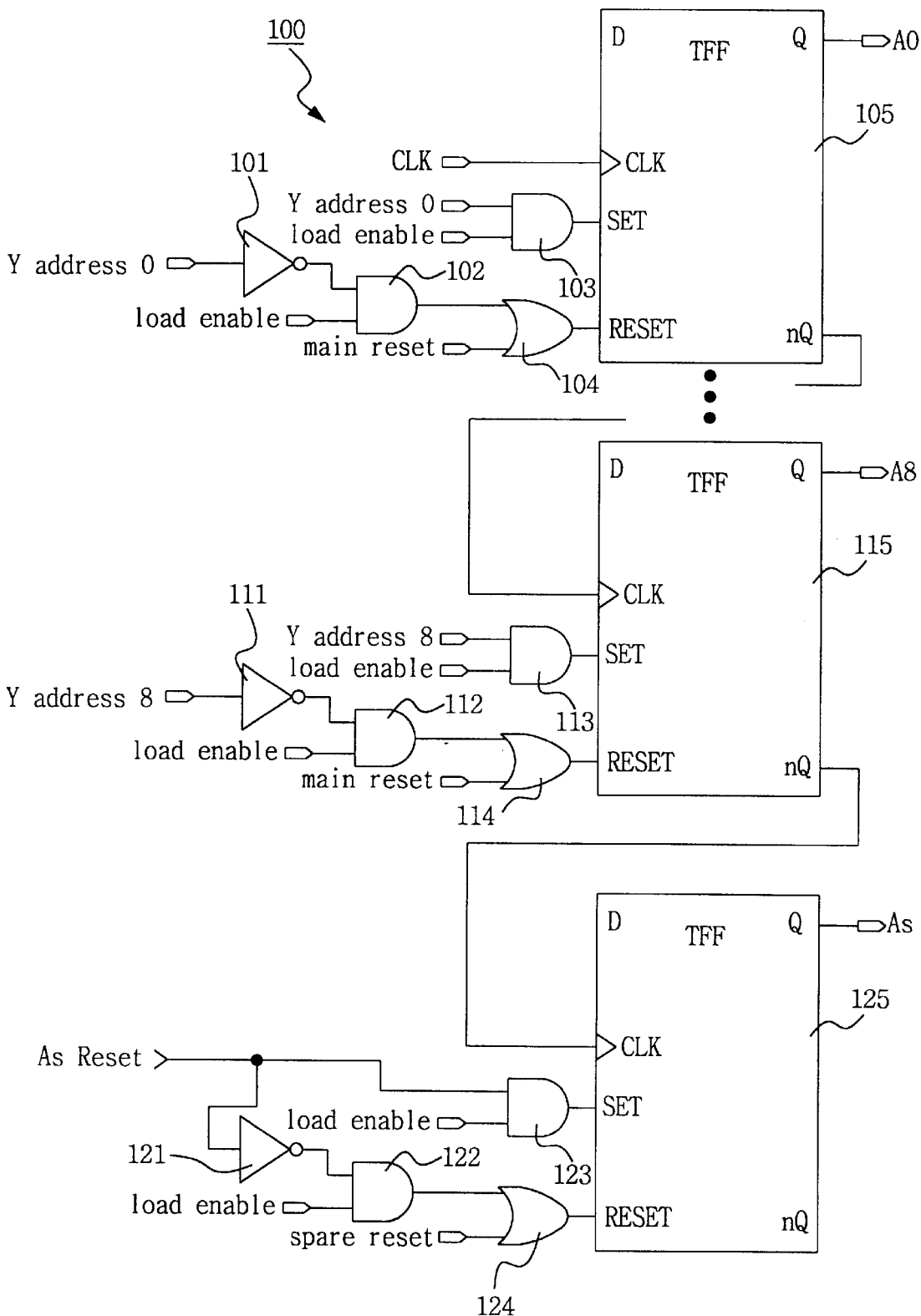
FIG. 4 is a circuit diagram of the address counter in FIG. 3A.

FIG. 4 is a circuit diagram of the address counter 100 shown in FIG. 3A. The address counter 100 comprises ten unit counters connected to each other, each counter comprises a T-flip-flops (TFF) 105, . . . , 115, 125. Each unit counter comprises a counting output terminal of one bit. Output bits As of TFF 125 indicates the entrance into the spare memory array 20 and the output bits A0 to A8 are counting bits. Each TFF comprises a data terminal D, a clock terminal CLK, a set terminal SET and a reset terminal RESET as input terminals, and an output terminal Q and an inversion terminal nQ as output terminals.

For example, the flip flop 105 receives as input a clock signal CLK at the clock terminal CLK, and a SET signal at the SET terminal, wherein the SET signal comprises the output of the AND gate 103, which AND-gates a column address "0" and a "load enable" signal. A reset signal RESET is produced from the column address "0", the "load enable" signal, and a "main reset" signal by an inverter 101, AND gate 102, and OR gate 104.

The flip flop 115 receives, as input to CLK terminals, an output of an inversion terminal nQ of an adjacent counter, and receives, as input to the SET terminal, an output of the AND gate 103, which AND-gates the column address "8" and the "load enable" signal. A reset signal RESET is produced by an inverter 111, AND gate 112, and OR gate 114.

The flip flop 125 receives, as input to the CLK terminal, an output of the inversion terminal nQ of the counter 115, and receives, as input to the SET terminal, an output of the AND gate 123. A reset signal RESET is produced from As Reset of the gate 60 in FIG. 3A, the "load enable" signal, and a "spare reset" signal by an inverter 121, AND gate 122, and OR gate 124.

The counters of the address counter 100 receives the "load enable" signal, and activates the SET terminal or the RESET terminal when the address from the address buffer 70 is "0" or "1". Therefore, the logic of the output terminal Q is "1" or "0".

Since the output terminal Q and the inversion output terminal nQ of the address counter 100 respectively comprise a present state and its inverted state at a rising edge of the clock CLK, the address counter performs an address counting operation.

Figure 5:
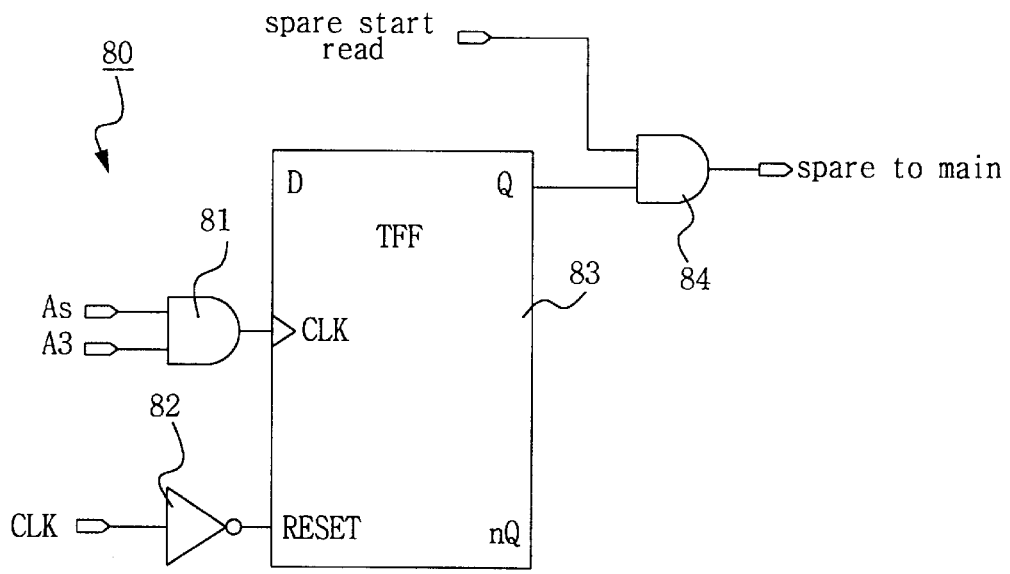
FIG. 5 is a circuit diagram of the spare to main controller in FIG. 3A.

FIG. 5 is a circuit diagram of the spare to main controller 80 shown in FIG. 3A. The spare to main controller 80 comprises a AND gate 81 for AND-gating the counting outputs As and A3, an inverter 82 for inverting a clock CLK, a D-flip flop 83 receiving an output of the AND gate 81 at CLK terminal and an output of the inverter 82 at a RESET terminal and latching the output of the inverter 82, and a AND gate 84 for ANDgating the output of the D-flip flop 83 and the "spare start read" signal. The output of the AND gate 84 is a "spare to main" signal.

Figure 6:
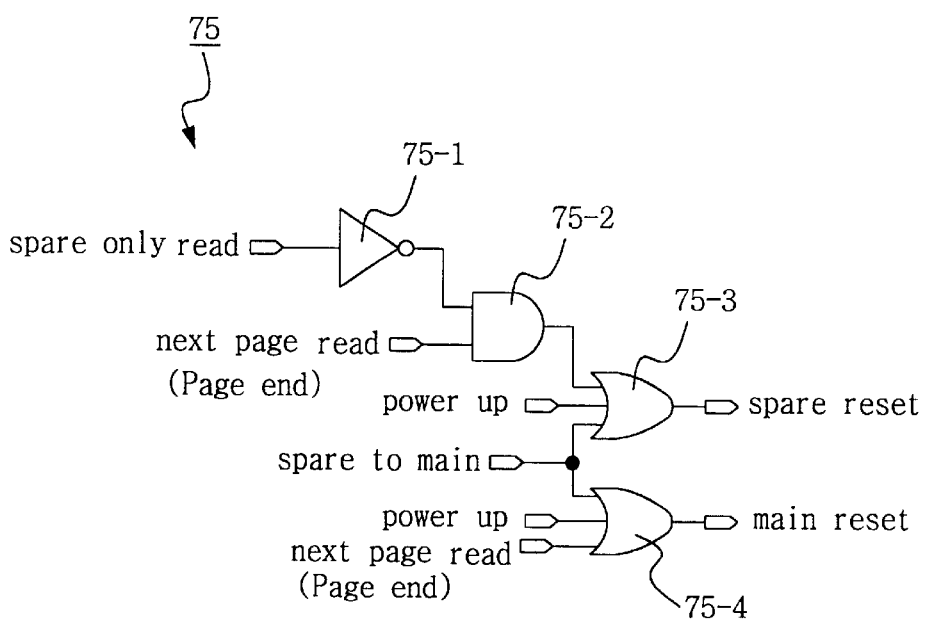
FIG. 6 is a circuit diagram of the reset controller in FIG. 3A.

FIG. 6 is a circuit diagram of the reset controller 75 shown in FIG. 3A. The reset controller 75 comprises an inverter 75-1 for inverting a "spare only read" signal; a AND gate 75-2 for AND-gating an output of the inverter 75-1 and a "next page read" signal which comprises (which comprises a delay signal of the "page end" signal); an OR gate 75-3 for OR-gating an output of the AND gate 75-2, a "power-up" signal and the "spare to main" signal; and an OR gate 75-4 for OR-gating the "spare to main" signal, the "power-up" signal and the "next page read" signal (which comprises a delay signal of the "page end" signal). The output of the OR gate 75-3 is the "spare reset" signal and the output of the OR gate 75-4 is the "main reset" signal.

Figure 7:
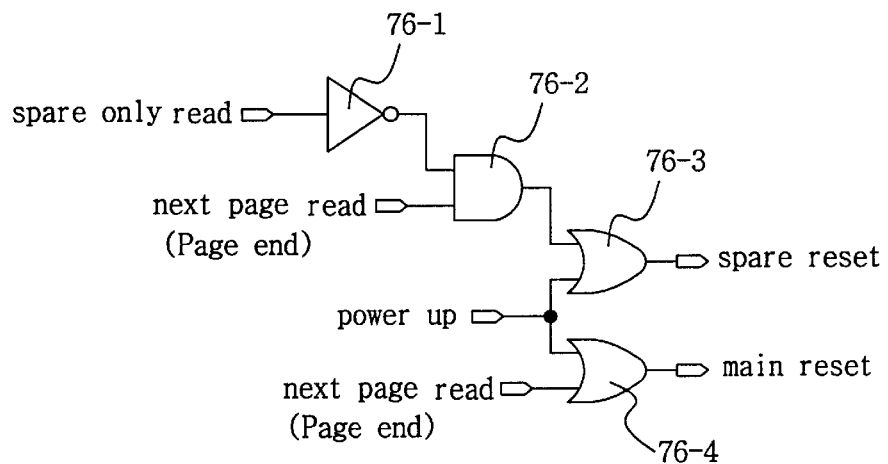
FIG. 7 is a circuit diagram of the reset controller in FIG. 3B.

FIG. 7 is a circuit diagram of the reset controller shown in FIG. 3b. The controller comprises an inverter 76-1, an AND gate 76-2, an OR gate 76-3, and an OR gate 76-4, but it does not receive the "spare to main" signal. Thus, the conventional nonvolatile device in FIG. 3B cannot distinguish the spare memory array 20 and the main memory array 10.

Figure 8:
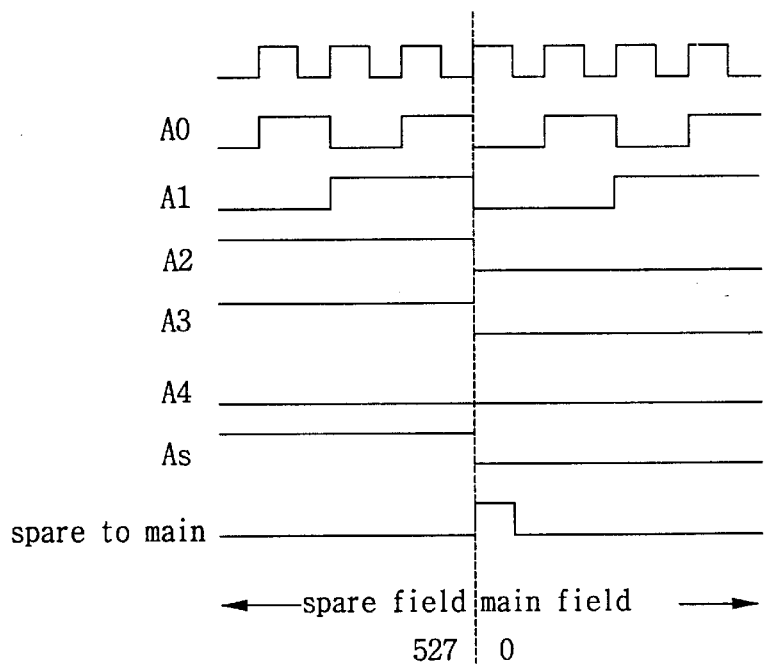
FIG. 8 is a timing diagram illustrating an operation of the spare to main controller in FIG. 5.

FIG. 8 is a timing diagram illustrating the generation of the "spare to main" signal.

Figure 9:
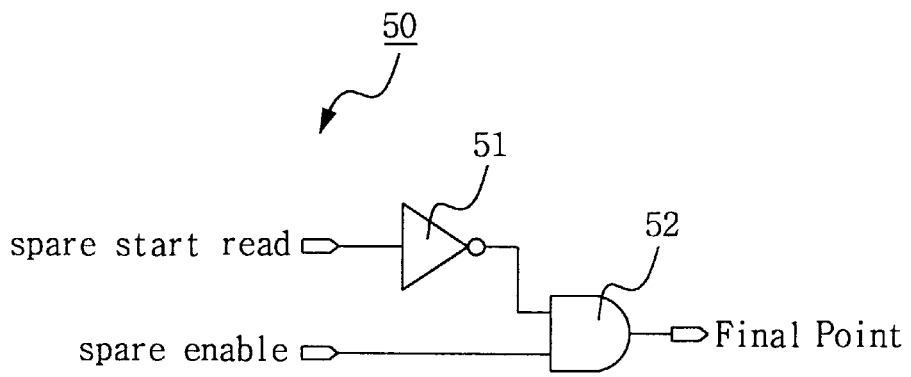
FIG. 9 is a circuit diagram of the final point moving circuit in FIG. 3A.

FIG. 9 is a circuit diagram of the final point moving circuit 50 shown in FIG. 3A. The circuit 50 comprises an inverter 51 for inverting a "spare start read" signal, and an AND gate 52 for AND-gating an output of the inverter 51 and a "spare enable" signal. The output of the AND gate 52 is the "final point" signal.

Figure 10:
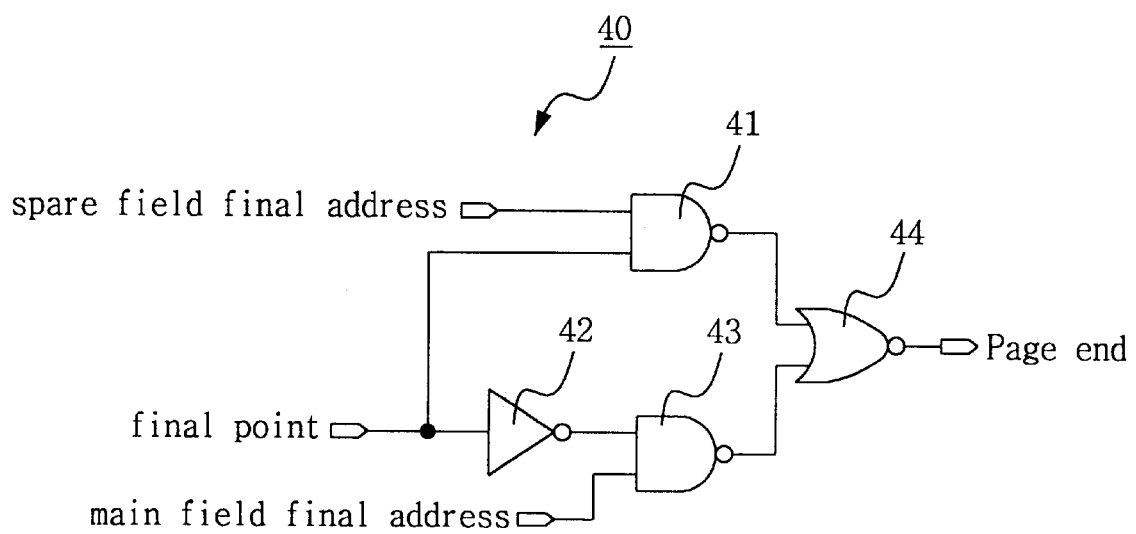
FIG. 10 is a circuit diagram of the final column address detector in FIG. 3A.

FIG. 10 is a circuit diagram of the final Y address detector (FYAD) 40 shown in FIG. 3A. The detector 40 comprises a NAND gate 41 for NAND-gating a spare memory array final address signal and the "final point" signal; an inverter 42 for inverting the "final point" signal; a NAND gate 43 for NAND-gating an output of the inverter 42 and a main field final address signal; and a NOR gate 44 for receiving outputs of the NAND gates 41, 43 and generating a NOR response. The output of the NOR gate 44 is a "page end" signal.

A read operation mode according to an embodiment of the present invention will now be explained in detail with reference to FIGS. 3, 4–6 and 8–10.

First, memory cell transistors of one page in the main memory array 10 and the spare memory array 20 are selected according to row addresses decoded by the X decoder 2. And, all data in one page are at one time stored in the sense amplifier and latch 4, 6 (which comprises a page buffer). In a read operation mode, the column selector 7 enables the sense amplifier and latch 6 connected to the spare memory array 20 earlier than the sense amplifier and latch 4 connected to the main memory array 10, to output data stored in the spare memory array 20. Meanwhile, the gate 60 receives an activated "spare start read" signal and provides the signal to the address counter 100. The address counter 100 counts the address of the memory cell array upon receiving a "load enable" signal and a "0" or "1" address from the column address buffer 70.

By the address counter 100, logic addresses "0" to "15" are assigned to the physical addresses "512" to "527" of the spare memory array 20 and the logic addresses "16" to "527" are assigned to the physical addresses "0" to "511" of the main memory array 100. That is, the address counter 100 counts the physical addresses of the memory cell array in the order of 512, 513, . . . , 526, 527, 0, 1, . . . , 510, 511.

After the address "527" is selected, the address counter 100 is reset at a next clock by the reset controller 75 and moved from "527" to "0". More specifically, the reset controller 75 receives the "spare to main" signal from the spare to main controller 80 and generates a "spare reset" signal and a "main reset" signal, thereafter applying them to the OR gates 104, 114, 124 connected to the T-flip flops 105, 115, 125 (See FIG. 4). As a result, the address counter 100 counts up "527" according to a physical address, and, after reset, again counts from "0" to "511". The "spare to main" signal is produced when the physical address is "527" and the "spare start read" signal is active.

Referring to FIG. 5, because the reset terminal RESET of the T-flip flop 83 receives an inverted signal of the clock CLK, the output terminal Q always outputs the value "0" at a falling edge of the clock CLK. When As=1 and A3=1, that is, the physical address is "527" after the other addresses of the spare memory array 20 are counted, the logic value of the output terminal Q becomes "1". Because the D-flip flop 83 is reset at a falling edge of the clock, the output of the output terminal Q is synchronized to the clock. The output of the flip flop 83 is AND-gated with the "spare start read" signal by the AND gate 84. Accordingly, when the "spare start read" signal is activated, the "spare to main" signal is generated; otherwise, the signal is always fixed as "0".

FIG. 8 shows the generation timing diagram of the "spare to main" signal. As a result, the address counter 100 counts the physical addresses in the order of 512, 513, . . . , 526, 527, 0, 1, . . . , 510, 511 by the reset controller 75.

After data of a final column address is read, the read operation mode proceeds to a next page. At this time, the final Y address decoder 40 (FYAD) detects the data of the final column address. The FYAD 40 is activated at the physical address "511" and outputs a "page end" signal. The "page end" signal is delayed by a predetermined period of time and applied to the reset controller 75.

In the conventional read operation modes, the FYAD 40 is activated at a final column address of the main memory array. But, in the read operation mode according to an embodiment of the present invention, the FYAD 40 is activated at a final column address of the spare memory array. Further, the FYAD 40 is activated at a final column address of the main memory array, but the final column address to be activated is different from those in the conventional modes. That is, in the conventional read operation modes, the final column address is "527" when a spare memory array enable signal is activated. But, in the read operation mode, the final column address is "511" of the main memory array when the enable signal is activated.

Such an operation can be performed by the final point moving circuit 50 shown in FIG. 9. When an output signal of the final point moving circuit 50, that is, the "final point" signal is activated at "511", as shown in FIG. 10, the "final point" signal is input to one input of the NAND gate 41 and the inverter 42 of the FYAD 40. And, the FYAD 40 outputs a "page end" signal of the NOR gate 44 at the final column address "511". Therefore, when the reset controller 75 resets the address counter 100, the address counter 100 counts the physical addresses in the order of 512, 513, . . . , 526, 527, 0, 1, . . . ,510, 511 even at the next page.

Accordingly, a read operation according to a preferred embodiment of the present invention can read data in the spare memory array earlier than the data in the main memory array in response to an external command without changing in the structure of the column decoder 30 and the column selector 7. Further, the read operation can perform conventional read operation modes such as a common sequential read mode and a spare start sequential read operation mode. While the invention has been described in terms of preferred embodiments, those skilled in the art will recognize that the invention can be practiced with modification within the sprit and scope of the appended claims. For example, the internal structure of the address counter and the corresponding controller can be modified or changed according to any required conditions.

What is claimed is:

1. A method of reading data in a nonvolatile semiconductor memory device comprising a spare memory cell array and a main memory cell array comprising a plurality NAND cell strings, wherein physical addresses of the main memory cell array are placed prior to physical addresses of the spare memory cell array, the method comprising the steps of:
   assigning logical addresses of the spare memory cell array prior to logical addresses of the main memory cell array in response to a first control signal; and
   reading data stored in the spare memory cell array earlier than data in the main memory cell array using the logical addresses.

2. The method of claim 1, wherein the spare memory cell array stores error correction data or page information data.

3. The method of claim 1, wherein the step of reading data comprises reading a page of data by sequentially reading data beginning from the spare memory cell array to the main memory cell array.

4. The method of claim 1, further comprising the step of reading data stored in the main memory cell array by selecting logical addresses of the spare memory cell array later than logical addresses of the main memory cell array in response to a second control signal.

5. The method of claim 1, wherein the logical addresses from "0" of "15" are assigned to the physical addresses from "512" to "527" of the spare memory cell array, and the logical addresses from "16" to "527" are assigned to the physical addresses from "0" to "511" of the main memory cell array.

6. The method of claim 1, wherein the step of assigning the logical addresses of the spare memory cell array prior to the logical addresses of the main memory cell array is performed by a counting operation of the nonvolatile semiconductor memory device.

7. A nonvolatile semiconductor memory device, comprising:
   a memory cell array comprising a main memory cell array and a spare memory cell array comprising a plurality NAND cell strings, wherein physical addresses of the main memory cell array are placed prior to physical addresses of the spare memory cell array;
   a column selector for selecting column path of the memory cell array;
   a column decoder for applying a column decoding signal to the column selector;
   an address counter for counting external addresses to output a column address counting signal to the column decoder, wherein the address counter counts logical addresses of the spare memory cell array prior to logical addresses of the main memory cell array in response to a spare start read signal at a spare start whole page sequential read mode, and wherein the address counter counts the logical addresses of the main memory cell array prior to the logical addresses of the spare memory cell array at a main start whole page sequential read mode;
   a final point moving circuit for receiving the spare start read signal and a spare enable signal to generate a final point signal;
   a final column address detector for detecting a final column address in response to the final point signal to enter into a next spare start whole page sequential read mode and outputting the detected address as a page end signal;
   a spare to main controller for generating a spare to main signal in response to the spare start read signal; and
   a reset controller for resetting the address counter in response to the page end signal and the spare to main signal to count the addresses of the memory cell array from zero (0) logical address.

8. The device of claim 7, wherein the address counter comprises a plurality of unit counters.

9. The device of claim 8, wherein the address counter comprises a cascade of T-flip flops.

10. The device of claim 7, wherein the spare memory cell array stores error correction code data or page information data.

11. The device of claim 7, wherein the nonvolatile semiconductor reads data in the memory cell array by a page unit.

12. The device of claim 7, wherein the logical addresses from "0" to "15" are assigned to the spare memory cell array and the logical addresses from "16" and "527" are assigned to the main memory cell array in the spare start whole page sequential read mode.

13. A method of reading data in a nonvolatile semiconductor memory device comprising a spare memory cell array and a main memory cell array, comprising the step of:

performing one of a main data only sequential read mode, a spare data only sequential read mode, and a main start whole page sequential read mode, in response to at least a first control signal that indicates data is to be read in the main memory cell array earlier than in the spare memory cell array; and performing a spare start whole page sequential read mode in response to at least a second control signal that indicates data is to be read in the spare memory cell array earlier than in the main memory cell array by assigning logical addresses of the spare memory cell array prior to logical addresses of the main memory cell array.

14. The method of claim 13, wherein the logical addresses of the main memory cell array are assigned prior to the logical addresses of the spare memory cell array in response to the first control signal.

15. The method of claim 13, wherein the logical addresses of the spare memory cell array are assigned prior to the logical addresses of the main memory cell array in response to the second control signal.

16. The method of claim 13, further comprising the step of resetting the logical address of the main memory cell array to zero (0) address at the main start whole page sequential read mode.

17. A method for reading data in a nonvolatile semiconductor memory device comprising a spare memory cell array and a main memory cell array comprising a plurality of NAND cell strings, the method comprising the steps of:

receiving a first control signal that indicates data is to be read in the spare memory cell array earlier than in the main memory cell array;

counting addresses of the spare memory cell array and reading data at the counted addresses of the spare memory cell array; and counting addresses of the main memory cell array and reading data at the counted addresses of the main memory cell array after counting each address of the spare memory cell array.

18. The method of claim 17, further comprising the steps of:

counting the addresses of the main memory cell array prior to the addresses of the spare memory cell array in response to a second control signal that indicates data is to be read in the main memory cell array earlier than in the spare memory cell array; and reading the data in the main memory cell array earlier than data in the spare memory cell array.

19. The method of claim 17, wherein physical addresses of the main memory cell array are placed prior to physical addresses of the spare memory cell array, and logical addresses of the spare memory cell array are assigned prior to logical addresses of the main memory cell array.

20. The method of claim 17, further comprising the step of resetting the counting process after counting each address of the spare memory cell array to begin counting the addresses of the main memory cell array from zero (0) address.

* * * * *